United States Patent [19]
Miyamoto

[11] Patent Number: 6,043,158
[45] Date of Patent: Mar. 28, 2000

[54] SEMICONDUCTOR DEVICE WITH CONTACT HOLES DIFFERING IN DEPTH AND MANUFACTURING METHOD THEREOF

[75] Inventor: Koji Miyamoto, Yokohama, Japan

[73] Assignee: Kabushiki Kaisha Toshiba, Kawasaki, Japan

[21] Appl. No.: 09/007,538

[22] Filed: Jan. 15, 1998

Related U.S. Application Data

[62] Division of application No. 08/768,632, Dec. 18, 1996, abandoned.

[30] Foreign Application Priority Data

Dec. 19, 1995 [JP] Japan ................................ 7-330420

[51] Int. Cl.[7] .............................................. H01L 21/302
[52] U.S. Cl. ........................................ 438/692; 438/700
[58] Field of Search ................................ 438/690, 691, 438/692, 700, 693; 257/380–384

[56] References Cited

U.S. PATENT DOCUMENTS

| | | | |
|---|---|---|---|
| 4,767,724 | 8/1988 | Kim et al. ............................ | 257/752 |
| 4,879,257 | 11/1989 | Patrick ................................. | 437/195 |
| 5,204,286 | 4/1993 | Doan ................................... | 257/758 |
| 5,381,046 | 1/1995 | Cederbaum et al. ................ | 257/760 |
| 5,471,093 | 11/1995 | Cheung ............................... | 257/752 |
| 5,479,054 | 12/1995 | Tottori ................................ | 257/758 |
| 5,489,547 | 2/1996 | Erdeljac et al. ..................... | 437/60 |
| 5,705,426 | 1/1998 | Hibino ................................ | 437/190 |

FOREIGN PATENT DOCUMENTS

| | | | |
|---|---|---|---|
| 4-003457 | 1/1992 | Japan ................................. | 257/382 |
| 5-347411 | 12/1993 | Japan ................................. | 257/383 |
| 5347411 | 12/1993 | Japan ................................. | 257/383 |

*Primary Examiner*—Benjamin L. Utech
*Assistant Examiner*—Kin-Chan Chen
*Attorney, Agent, or Firm*—Banner & Witcoff, Ltd.

[57] ABSTRACT

An insulating film has steps on its surface according to the steps on the substrate. The surface of the insulating film is planarized by CMP. The insulating film has thick portions and thin portions. In the thick and thin portions of the insulating film, first and second contact holes are made. The diameter of shallow second contact holes made in the thin portions of the insulating film is set smaller than that of deep first contact holes made in the thick portions of the insulating film. The first and second contact holes are filled with tungsten simultaneously by CVD techniques to form first and second contacts. The surfaces of the first and second contacts coincide with the surface of the insulating film.

22 Claims, 3 Drawing Sheets

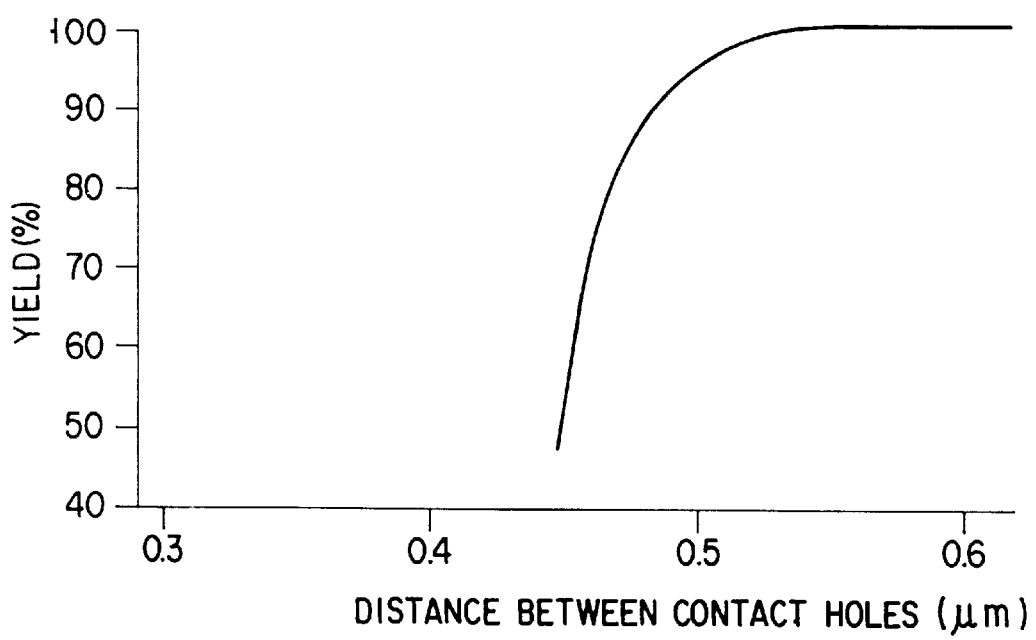
F I G. 5

SEMICONDUCTOR DEVICE WITH CONTACT HOLES DIFFERING IN DEPTH AND MANUFACTURING METHOD THEREOF

This application is a divisional of prior application Ser. No. 08/768,632, filed Dec. 18, 1996, now abandoned.

BACKGROUND OF THE INVENTION

This invention relates to a semiconductor device and a manufacturing method thereof, and more particularly to a semiconductor device with contact holes differing in depth and a manufacturing method thereof.

As the elements of semiconductor devices have been getting smaller and smaller in these years, multilayer interconnections have been needed for the devices. In this move, device surface planarization is getting important and process techniques, such as CMP (Chemical Mechanical Polishing), are in wide use. The CMP can remove steps at the device surface and planarize the surface. This helps improve the margin of the process in using lithography techniques or etching techniques, so the CMP is becoming indispensable to the miniaturization of semiconductor devices.

With the devices getting smaller, via holes for connecting the upper-layer interconnections to the lower-layer interconnections and contact holes for connecting interconnections to gate interconnections or impurity diffused layers have begun to be filled with suitable material, such as tungsten.

When the planarization techniques and filling techniques are used, the formation of the via holes on the lower-layer interconnections and the upper-layer interconnections is easy in the process of forming multilayer interconnections, because the surface of the insulating film is flat. At the time of the formation of the lower-layer interconnections, however, there will be an adverse effect because the formation of the lower-layer interconnections will be affected seriously by the steps located under them.

With conventional semiconductor manufacturing techniques, the surface of the insulating film was not subjected to the planarization process, with the result that the contact holes were made with the steps remaining at the surface. Since the thickness of the insulating film was almost the same in various places on the film, the depth of the contact holes made in various places on the insulating film was almost the same. As a result, it was easy to fill these contact holes with conductive material. With the introduction of the planarization of insulating films as a result of advances in the miniaturization of semiconductor elements, however, when the contact holes with different depths made in the planarized insulating films are filled with conductive material, various difficulties will arise.

Here, explanation will be given of a case where a semiconductor device with contact holes differing in depth is formed at an insulating film having portions differing in thickness. At the surface of a semiconductor substrate, element-isolating regions, MOS transistors, and the like are formed. The MOS transistors have impurity diffused layers serving as source and drain regions and gate electrodes formed via gate oxide films. The gate electrodes are connected to the gate interconnections, which are also arranged on the element-isolating regions. These element-isolating regions and other related portions form the steps.

Next, on the semiconductor substrate, an insulating film made of, for example, $SiO_2$, is formed by CVD techniques and the steps produced at the surface of the insulating surface are planarized by the CMP. In the insulating film, the thickness on the impurity diffused layer is greater than that on the element-isolating region. In the planarized insulating film, contact holes for exposing part of the impurity diffused layer and contact holes for exposing part of the gate interconnections on the element-isolating regions are made. The depth of the contact hole for exposing the impurity diffused layer is greater than that of the contact hole for exposing the gate interconnection on the element-isolating region. Thereafter, inside the deep contact holes and shallow contact holes, a conductive material made of, for example, tungsten, is grown to form contacts in the individual holes.

However, it was difficult to fill each of the deep contact holes and shallow contact holes with a tungsten film. Specifically, when the growth rate of the tungsten film is adjusted to the shallow contact holes so that the tungsten film may grow sufficiently in the shallow contact holes, the growth of the tungsten film in the deep contact holes is insufficient, contributing to disconnections in a later process of forming interconnections.

To prevent this, the growth rate of the tungsten film is adjusted to the deep contact holes so that the deep contact holes may be filled sufficiently with a tungsten film. In this case, however, the tungsten overgrows in the shallow holes. The overgrown tungsten film overflows the shallow contact holes. The overflowed tungsten contributes to the short-circuiting of interconnections.

The short-circuited interconnections lead to a drop in the yield. Even when the overflowed tungsten causes no short circuit, it contributes to a decrease in the reliability.

FIG. 5 shows the relationship between the distance between the deep contact holes and the shallow contact holes and the yield for the short-circuiting of interconnections.

FIG. 5 shows a case where the depth of the deep contact holes is assumed to be, for example, 12000 angstroms, the depth of the shallow contact holes is assumed to be, for example, 6300 angstroms, and the diameter of both contact holes is assumed to be from 0.45 to 0.65 $\mu$m.

As seen from the figure, the yield decreases when the distance between both of the contact holes is 0.5 $\mu$m or less. Specifically, with the above-described dimensions, whether the deep contact holes and shallow contact holes are arranged with a distance of 0.55 $\mu$m between them, there is much danger that they will be short-circuited with each other.

As described earlier, it has been difficult to fill contact holes differing in depth suitably with conductive material at the same time.

BRIEF SUMMARY OF THE INVENTION

The object of the present invention is to provide a semiconductor device capable of filling a plurality of holes differing in depth with the right amounts of a conductive material, improving the yield, and achieving high reliability and a manufacturing method thereof.

The forgoing object is accomplished by providing a semiconductor device comprising: a substrate layer with steps; an insulating film formed on the substrate layer, the insulating film having not only a planarized surface but also thick portions and thin portions according to the steps; first holes made in the thick portions of the insulating film; second holes made in the thin portions of the insulating film, the diameter of the second holes being set smaller than that of the first holes; first contacts made of conductive material filled in the first holes; and second contacts made of conductive material filled in the second holes, the position of the surfaces of the first and second contacts substantially coinciding with the position of the surface of the insulating film.

The foregoing object is also accomplished by providing a method of manufacturing semiconductor devices, comprising the steps of: forming an insulating film on a substrate layer with steps; planarizing the insulating film, the planarized insulating film having thick portions and thin portions; making deep first holes in the thick portions of the insulating film and shallow second holes in the thin portions, the diameter of the second holes being set smaller than that of the first holes; and growing conductive material selectively in the first and second holes and filling the first and second holes with the conductive material simultaneously to produce first and second contacts, the surfaces of the first and second contacts coinciding with the surface of the insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a diagram showing the relationship between the deep contact holes and shallow contact holes and the yield for short-circuited interconnections.

DETAILED DESCRIPTION OF THE INVENTION

Hereinafter, referring to the accompanying drawings, embodiments of the present invention will be explained.

Figure 1:
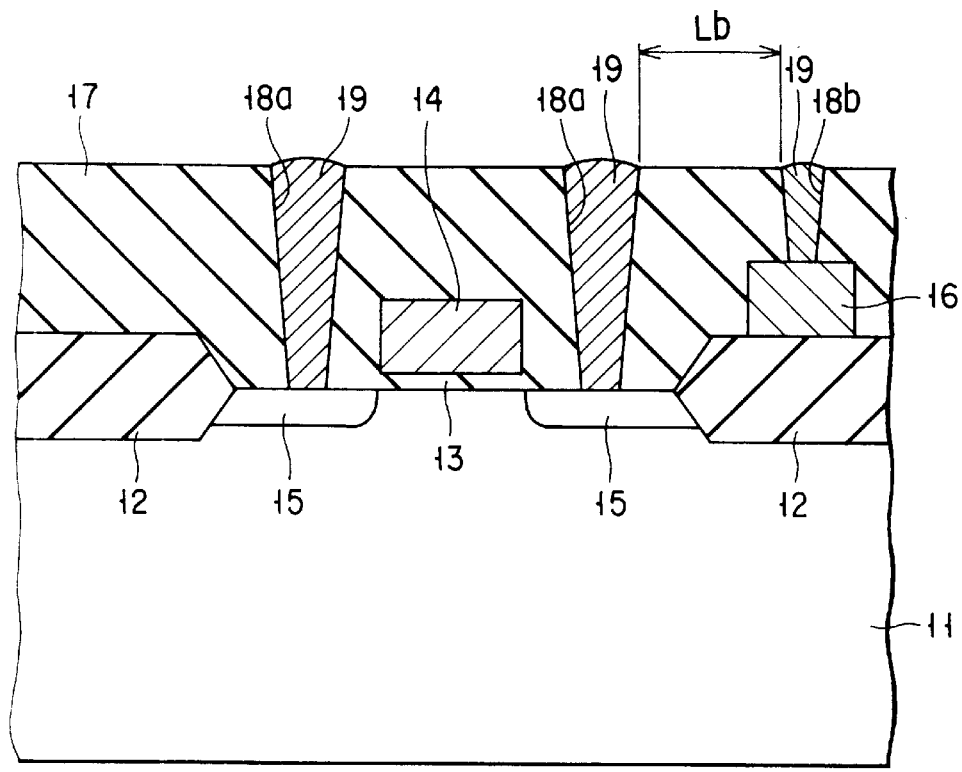
FIG. 1 is a schematic sectional view of a semiconductor device according to a first embodiment of the present invention.

FIG. 1 schematically shows the configuration of a semiconductor device according to an embodiment of the present invention.

With the semiconductor device, for example, element-isolating regions 12 are formed at the surface of a semiconductor substrate 11. The element-isolating regions 12 form steps. On an element region of the semiconductor substrate 11 isolated by the element-isolating regions 12, a gate electrode 14 is formed via a gate oxide film 13. In the semiconductor substrate 11 on both sides of the gate electrode 14, impurity diffused layers 15 are formed. On the top of at least one of the element-isolating regions 12, a gate interconnection 16 connected to the gate of another transistor (not shown) is formed. The gate interconnection 16 also makes a step.

Thereafter, on the semiconductor substrate 11, an insulating film 17 is formed as an interlayer film so as to cover each of the gate electrode 14, impurity diffused layers 15, and gate interconnection 16. The surface of the insulating film 17 is planarized by the CMP. In the insulating film 17, the thickness on the impurity diffused layer is greater than that on the element-isolating region. In the insulating film 17, contact holes 18a for exposing part of the impurity diffused layer 15 and contact holes for exposing part of the gate interconnection 16 are made using known lithography techniques and etching techniques. The depth of the contact holes 18a for exposing the impurity diffused layer 15 is greater than that of the contact holes 18b for exposing the gate interconnection 16 on the element-isolating region. The diameter of the contact holes 18b is set smaller than that of the contact holes 18a.

Thereafter, for example, a tungsten film 19 is grown inside the deep contact holes 18a and shallow contact holes 18b to form contacts. The tungsten is grown by CVD techniques using, for example, tungsten fluoride $WF_6$ as raw material gas.

With the semiconductor device thus constructed, the growth of the tungsten film 19 in the shallow contact holes 18b can be delayed as compared with the growth of the tungsten film 19 in the deep contact holes 18a. As a result, it is possible to grow the tungsten film 19 in both of the deep contact holes 18a and shallow contact holes 18b simultaneously. This makes it possible to fill the contact holes 18a, 18b differing in depth with the right amounts of tungsten, which prevents the tungsten from overgrowing in the shallow contact holes 18b and overflowing the holes 18b, thereby improving the decrease of the yield.

Because the top surface of each contact is formed almost flat, it is not affected by the lower layer when the upper-layer interconnections are formed on it. Therefore, the top surface is particularly effective when multilayer interconnections are formed.

Next, the process of manufacturing the above-described semiconductor devices will be explained.

First, at the surface of the semiconductor substrate 11, the element-isolating regions 12 and gate oxide film 13 are formed.

Then, on the gate oxide film 13, the gate electrode 14 is formed and at the same time, the gate interconnection 16 is formed on the element-isolating region 12.

Thereafter, with the element-isolating regions 12 and gate electrode 14 as a mask, impurities are introduced into the semiconductor substrate 11 to form impurity diffused layers 15 acting as source and drain regions.

Next, an insulating film 17, such as $SiO_2$ containing phosphorus or boron, is formed on the semiconductor substrate 11 by CVD techniques. The top surface of the insulating film is planarized by the CMP, for example.

The deep contact holes 18a and shallow contact holes 18b for forming the contacts connected to the sources, drains, and gate electrodes and the contacts connected to the gate interconnections are made in the insulating film 17, using known lithography techniques and etching techniques.

At that time, the size of the deep contact holes 18a is made larger than that of the shallow contact holes 18b.

Specifically, the depth of the deep contact hole 18a is determined to be, for example, 12000 angstroms with its diameter ranging from 0.45 to 0.65 $\mu$m and the depth of the shallow contact hole 18b is 6300 angstroms with its diameter ranging from 0.35 to 0.55 $\mu$m. In addition, the distance Lb between the deep contact hole 18a and shallow contact hole 18b is set to, for example, 0.45 μm.

In the deep contact holes 18a and shallow contact holes 18b thus formed, the tungsten film 19 is selectively grown by CVD techniques to form the contacts connected to the impurity diffused layers 15 and the contact connected to the gate interconnection 16 simultaneously. At this time, the growth of the tungsten film 19 in the shallow contact holes 18b can be delayed as compared with the growth of the tungsten film in the deep contact holes 18a. This prevents the tungsten film 19 from sticking out from the shallow contact holes 18b, enabling the right amounts of the tungsten film 19 to grow in both of the deep contact holes 18a and shallow contact holes 18b. Consequently, the contacts on the impurity diffused layers 15 and the contact on the gate interconnection 16 are made almost flat.

Figure 3:
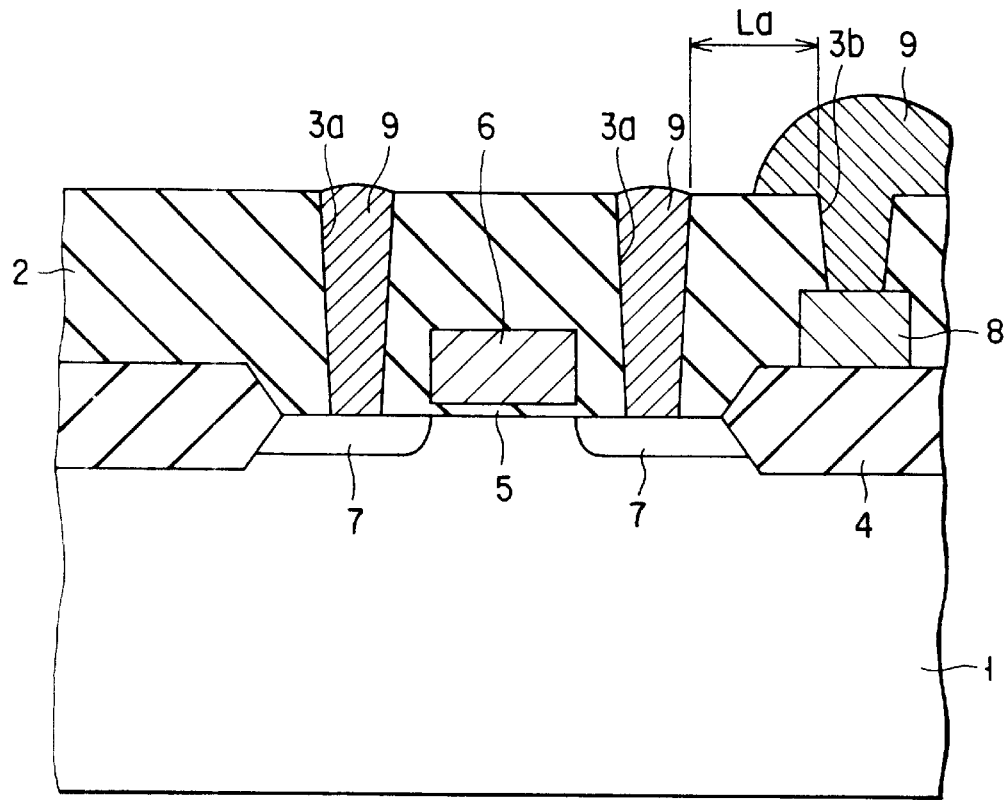
FIG. 3 is a sectional view to help explain a problem encountered in filling the contact holes with conductive material.

FIG. 3 illustrates a case where the deep contact holes and shallow contact holes are made so as to have the same diameter. In this case, when the deep contact holes are filled sufficiently with a tungsten film, the tungsten overflows the shallow contact holes. As a result, the distance La between the overflowed tungsten and nearby contacts becomes very short, contributing to the short-circuiting of interconnections. With the present invention, however, tungsten will never overflow the shallow contact holes, which prevents interconnections from short-circuiting and improves the yield.

Figure 2:
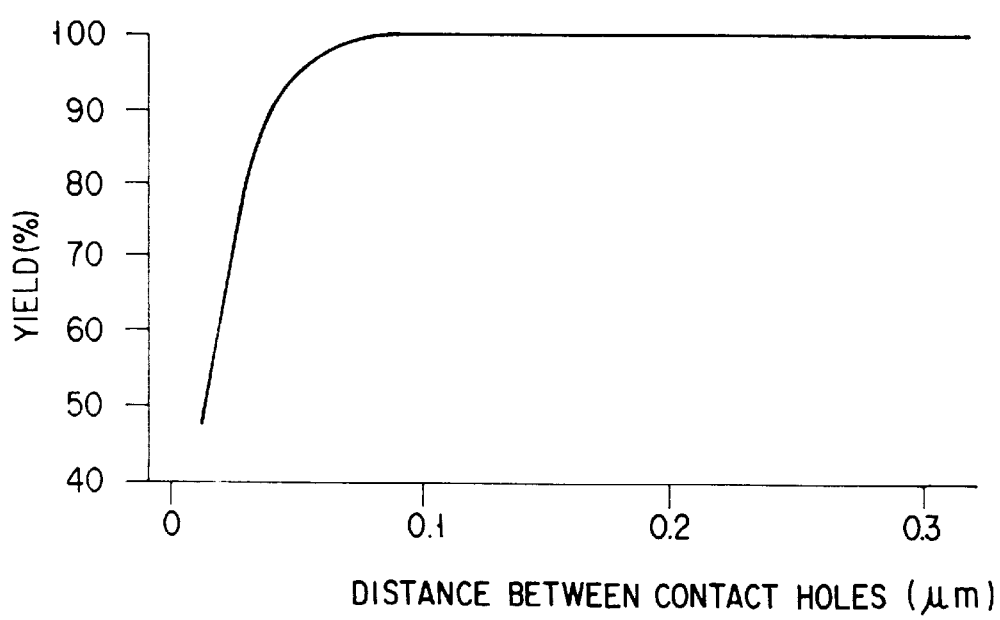
FIG. 2 is a diagram showing the relationship between the distance between contacts and the yield for short-circuiting in the semiconductor device of the present invention.

FIG. 2 shows the results produced by the present invention, or the relationship between the distance between the deep contact holes 18a and the shallow contact holes 18b in the semiconductor device and the yield for the short-circuiting of interconnections. As seen from the figure, with the present embodiment, the yield does not decrease until the distance Lb between both contact holes 18a, 18b is 0.1 μm or less. That is, with the above dimensions, because the tungsten film 19 is prevented from sticking out from the shallow contact holes 18b, the deep contact holes 18a can be arranged closer to a distance of about 0.1 μm from the shallow contact holes 18b. Therefore, even when the sub-microscopic design rules on the order of about 0.1 μm are employed, the yield is prevented from decreasing.

In the embodiment, the case where the contact holes are filled with conductive material has been explained. Namely, explanation has been given of the case where the insulating film is planarized before the formation of the lower-layer interconnections and then the sources, drains, embedded contacts on the gate electrodes, and embedded contact on the gate interconnections are formed. The present invention is not restricted to this and may be applied to a case where via holes are formed.

Figure 4:
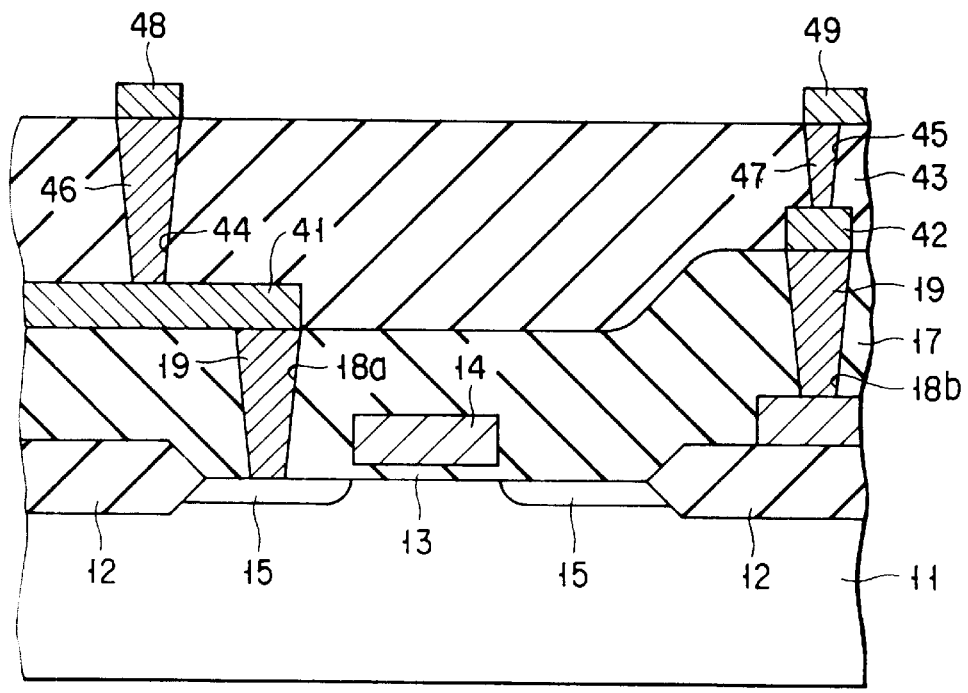
FIG. 4 is a sectional view of a second embodiment of the present invention.

FIG. 4 illustrates a second embodiment of the present invention and shows a case where via holes are formed. In FIG. 4, the same parts as those in FIG. 1 are indicated by the same reference symbols. Here, an insulating film 17 has not been planarized. On the insulating film 17, lower-layer interconnections 41, 42 are formed. The surfaces of the lower-layer interconnections 41, 42 and insulating film 17 are covered with an interlayer insulating film 43. The interlayer insulating film 43 is planarized by the CMP. In the interlayer insulating film 43, via holes 44, 45 for exposing part of the lower-layer interconnections 41, 42 are made. The diameter of the shallow via holes 45 made in the thin portion of the interlayer insulating film 43 is set smaller than the diameter of the deep via holes 44 made in the thick portion of the interlayer insulating film. The via holes 44, 45 are filled with tungsten films 46, 47, on which upper-layer interconnections 48, 49 are formed respectively.

The second embodiment also prevents the interconnections from short-circuiting and improves the yield.

In the first and second embodiments, the conductive material is not limited to the tungsten film. For instance, other materials, such as copper or aluminum, may be used as the conductive material.

Furthermore, the insulating film is not restricted to $SiO_2$. For instance, PSG or BPSG may be used as the insulating film.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

I claim:

1. A method of manufacturing semiconductor devices, comprising the steps of:

forming an insulating film on a substrate layer with steps;

planarizing said insulating film, the planarized insulating film having thick portions and thin portions;

making deep first holes in said thick portions of said insulating film and shallow second holes in said thin portions, a diameter of said second holes being smaller than a diameter of said first holes; and selectively growing conductive material in said first and second holes, without growing said conductive material on an upper surface of said insulating film, filling said first and second holes and simultaneously producing first and second contacts in said first and second holes, said first and second contacts having surfaces which are substantially flush with said upper surface of said insulating film.

2. A method according to claim 1, wherein the planarization is performed by CMP.

3. A method according to claim 1, wherein said conductive material is one of tungsten, copper, and aluminum.

4. A method according to claim 1, wherein said first and second contacts are formed by vapor growth using tungsten fluoride as raw material gas.

5. A method according to claim 1, wherein a distance between said first and second holes is about 0.1 μm.

6. A method according to claim 1, wherein said insulating film is a silicon oxide film.

7. A method according to claim 1, wherein said substrate layer is a substrate including at least element-isolating regions and MOS transistors.

8. A method according to claim 7, wherein said first contacts are connected to impurity diffused layers of said MOS transistors and said second contacts are connected to gate interconnections on said element-isolating regions.

9. A method according to claim 1, wherein said first and second holes are contact holes.

10. A method according to claim 1, wherein said insulating film is an interlayer insulating film covering first and second interconnections formed on said substrate layer.

11. A method according to claim 10, wherein said first and second holes are via holes made in said interlayer insulating film.

12. A method of manufacturing semiconductor devices, comprising the steps of:

forming an insulating film on a substrate layer, said insulating film having thick portions and thin portions;

making deep first holes in said thick portions of said insulating film and shallow second holes in said thin portions of said insulating film, a diameter of said second holes being smaller than a diameter of said first holes; and selectively growing conductive material in said first and second holes, without growing said conductive material on an upper surface of said insulating film, filling said first and second holes and simultaneously producing first and second contacts, said first and second contacts having surfaces which are substantially flush with said upper surface of said insulating film.

13. A method according to claim 12, wherein said conductive material is a material selected from the group consisting of tungsten, copper, and aluminum.

14. A method according to claim 12, wherein said first and second contacts are formed by vapor growth using tungsten fluoride as a raw gas material.

15. A method according to claim 12, wherein a distance between said first and second holes is about 0.1 micrometers.

16. A method according to claim 12, wherein said insulating film is a silicon dioxide film.

17. A method according to claim 12, wherein said substrate layer is a substrate including at least element-isolating regions and MOS transistors.

18. A method according to claim 17, wherein said first contacts are connected to impurity diffused layers of said MOS transistors and said second contacts are connected to gate interconnections on said element-isolating regions.

19. A method according to claim 12, wherein said first and second holes are contact holes.

20. A method according to claim 12, wherein said insulating film is an interlayer insulating film covering first and second interconnections formed on said substrate layer.

21. A method according to claim 20, wherein said first and second holes are via holes made in said interlayer insulating film.

22. A method of manufacturing semiconductor devices, comprising the steps of:

forming an insulating film on a substrate layer, said insulating film having thick portions and thin portions;

forming deep first holes in said thick portions of said insulating film and shallow second holes in said thin portions of said insulating film, a diameter of said second holes being smaller than a diameter of said first holes; and growing conductive material in said first and second holes and filling said first and second holes up to and not to exceed a level substantially coplanar with an upper surface of said insulating film to simultaneously produce first and second contacts having surfaces which are substantially flush with said upper surface of said insulating film.

* * * * *